United States Patent [19]
Wachtler et al.

[11] Patent Number: 6,071,801
[45] Date of Patent: Jun. 6, 2000

[54] METHOD AND APPARATUS FOR THE ATTACHMENT OF PARTICLES TO A SUBSTRATE

[75] Inventors: Kurt P. Wachtler; Gregory B. Hotchkiss, both of Richardson, Tex.

[73] Assignee: Texas Instruments Incorporated, Dallas, Tex.

[21] Appl. No.: 09/253,837

[22] Filed: Feb. 19, 1999

[51] Int. Cl.[7] .................................................. H01L 21/44
[52] U.S. Cl. .......................... 438/612; 438/613; 438/618
[58] Field of Search ..................................... 438/612, 613, 438/618

[56] References Cited

U.S. PATENT DOCUMENTS 5,620,927  4/1997  Lee .
5,909,634  6/1999  Hotchkiss et al. .
5,930,889  8/1999  Klein .

*Primary Examiner*—Kevin M. Picardat
*Assistant Examiner*—D. Mark Collins
*Attorney, Agent, or Firm*—Gary C. Honeycutt

[57] ABSTRACT

A method for populating an substrate (14) with particles (12, 16), comprising the steps of applying an adhesive coating (22) to both surfaces of a substrate (14) and loading the particles (12, 16) to the adhesive areas (30) of the adhesive coating (22), such that each surface of the substrate (14) is fully populated with the particles (12, 16) which may thereafter be reflowed simultaneously. The particles may be composed of a variety of compositions, including copper, other metals, alloys, and synthetic resin compounds, such as conductive plastics.

9 Claims, 3 Drawing Sheets

METHOD AND APPARATUS FOR THE ATTACHMENT OF PARTICLES TO A SUBSTRATE

TECHNICAL FIELD OF THE INVENTION

The present invention relates in general to the field of electronic device packaging and more particularly to a method and apparatus for attaching electrically conductive particles to a substrate.

BACKGROUND OF THE INVENTION

Without limiting the scope of the invention, its background is described in connection with electronic device packaging, as an example.

Modern electronic components utilize numerous integrated circuits. These integrated circuits are electrically connected to each other or to other electronic components. One method for connecting integrated circuits to electronic components utilizes an area array electronic package. The electronic connections between an integrated circuit packaged in an array package design and a printed circuit board (PCB) are typically composed of solder.

Integrated circuits may be connected to electronic components through a flip-chip electronic package design. The flip-chip electronic package is similar to the ball grid array electronic package in that solder balls are used to make a connection with other electronic components, such as a PCB. Solder balls are also used in a flip-chip design to attach the input and output ports of the substrate to the contact pads of the integrated circuit. As such, flip-chip packages do not require wire bonds. Solder balls or bumps may also be formed on the face of integrated circuits as they reside on semiconductor wafers before being sawed into individual dies.

In a typical Chip Scale Package (CSP) electronic packaging design, a previously bumped wafer (or die) is attached to contact pads on one face of an interposer or substrate. In a subsequent step, another set of solder spheres, typically larger in size, are attached to contact pads located on the opposite face of the interposer or substrate. These processes can be performed either in wafer form or on individual dies. The attachment of the larger spheres completes the package assembly and the wafer is ready for sawing into singular dies. The larger spheres of the finished package are commonly attached to another electronic component such as a printed circuit board (PCB). Often an elastomeric material called underfill is applied between the die and the substrate to assist in relieving stresses that develop between the die and the substrate due to thermal mismatch.

Therefore, an important step in the interconnection of many electronic components is the formation of solder balls in the area array electronic package.

Heretofore, in this field, solder bumps or balls have been typically formed utilizing one of four methods: (1) printing of solder paste through a stencil or mask; (2) electroplating; (3) evaporation; or (4) mechanical transfer of preformed solder spheres. Electroplating, printing of solder paste through a stencil or mask, and evaporation techniques have been typically utilized for forming solder bumps on wafers and integrated circuits; flip-chip and chip scale packages have commonly utilized printing of solder paste and mechanical transfer of solder ball techniques.

Transfer of solder balls has been customarily achieved by means of vacuum chucks or machined templates. Another method for transferring preformed solder balls utilizes formation of a pattern of dots onto a photoimageable coating laminated to an organic film. Typically the organic film is composed of a material having a high melting temperature that is capable of being exposed to temperatures exceeding 200 C. with very little degradation, such as polyimide.

The pattern is formed by placing a photomask on the coating and then exposing the coating to a dose of ultraviolet radiation. For example, for an area array package design, the photomask will contain a mirror image of the contact pads design. The areas protected by the photomask design retain their adhesiveness while the unprotected areas exposed to the ultraviolet radiation lose their adhesiveness. The array of adhesive areas corresponds to the pattern of contact pads found on the substrate, wafer or die to receive the solder connections.

After the adhesive areas are formed, solder balls are loaded onto the surface of the film and attached to the adhesive areas. The excess solder balls that lie on non-adhesive areas are removed. The populated film is then aligned and brought into contact with contact pads, which may be fluxed. A solder reflow is performed to transfer the solder balls from the adhesive areas to the contact pads of the substrate. Following the reflow cycle, the film is removed from the solder balls.

The process of forming a pattern of adhesive areas can be used to transfer both sets of solder spheres. The smaller, flip chip spheres to the wafer or die (flip chip) and the larger, CSP spheres to the interposer or substrate. However, two distinct processes are required with each procedure involving a sphere population step, alignment of the populated adhesive areas to the wafer or interposer and a solder reflow step.

SUMMARY OF THE INVENTION

In accordance with the present invention, it is preferable to eliminate the process of loading solder particles onto the semiconductor die and substrate in two separate steps. The adhesive film used to populate the die and substrate surface may be eliminated when applying the techniques of the present invention. Both sides of the substrate may be coated with an adhesive prior to loading solder particles. This method would eliminate steps involved in loading particles onto an adhesive coated film, aligning the film over the component intended for population and unloading particles onto substrate.

Therefore, a need has arisen for a method of attaching solder particles to a substrate, comprising the steps of forming a pattern of adhesive areas on the surface of the substrate, transferring thermal energy to the adhesive coated substrate surface, loading the particles onto the substrate surface, and attaching the particles to the adhesive areas. A need has also arisen for an apparatus for manufacturing an integrated circuit package, comprising an adhesive coated substrate surface heated to a temperature less than the melting point of the solder particles and a plurality of solder particles connected to the adhesive areas.

The present invention disclosed herein may comprise a method for the attachment of metal or solder particles to a substrate comprising the steps of applying an adhesive coating to both sides of a substrate or interposer surface, transferring thermal energy to the adhesive sheet, loading the particles to the adhesive area corresponding to contact pads located on each side of substrate surface, removing the particles not adhered to the adhesive areas, securely attaching the particles to the contact pads by a reflow process. In one embodiment of the present invention, applying metal or solder particles to substrate surface may also involve attaching an integrated circuit to the substrate surface at the same time or following the loading of solder particles to substrate surface.

The present invention may also comprise an apparatus for attaching particles to a substrate, comprising an adhesive sheet, a plurality of particles connected the adhesive sheet, and a mechanical device transferring kinetic energy to move the particles.

For a more complete understanding of the features and advantages of the present invention, reference is now made to the detailed description of the invention along with the accompanying figures.

DETAILED DESCRIPTION OF THE INVENTION

Figure 1A:
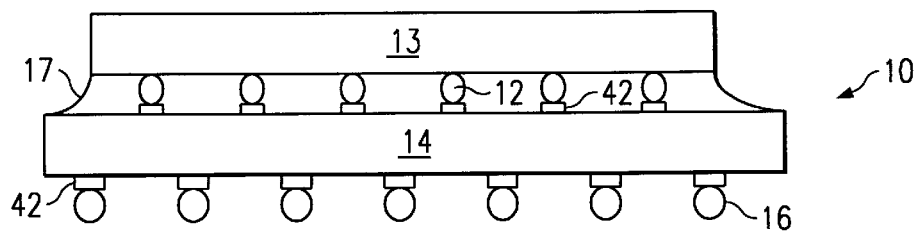
FIG. 1A is a cross sectional view of a area array package depicting a flip chip configuration utilizing the principles of the present invention.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Reference is now made to FIG. 1, in which an exemplary area array package is shown and generally designated as 10. The area array package 10 comprises a die 13 mounted on the surface of substrate or interposer 14. Substrate 14 on one side is populated with solder particles 12 for the attachment of die 13. The opposite side of substrate 14 is populated with solder particles 16, which may be attached to another substrate or printed circuit board (PCB) 15.

In one embodiment, the present invention provides a method and apparatus for applying an adhesive directly to both faces of the interposer or substrate 14 allowing for simultaneous transfer of solder particles 12 and 16 to each surface of substrate 14. The adhesive coating is affixed to the substrate 14 followed by forming adhesive areas coincident with each contact pad 42.

Solder particles 12 are then sprinkled on one surface first and captured by the adhesive areas on the contact pads 42. The opposite surface is then populated in the same manner with another set of solder particles 16. The solder particles 12 and 16 may be of different size depending on the packaging configuration used. Solder particles 12 and 16 are typically solder spheres having a diameter in a range of approximately 3 mils to approximately 30 mils; however, it should be understood by one skilled in the art that the principles of present invention are applicable to a variety of other dimensions and configurations, such as rectangular and cylindrical columns.

If both sets of solder particles 12 and 16 are of the same size, one population step may be satisfactory. The package 10 may then be reflowed to allow the two sets of solder particles 12 to melt and bond to their respective contact pads 42. Once solder particles 12 and 16 are reflowed to the contact pads 42, substrate 14 may be connected to another substrate or other electronic components.

Figure 1B:
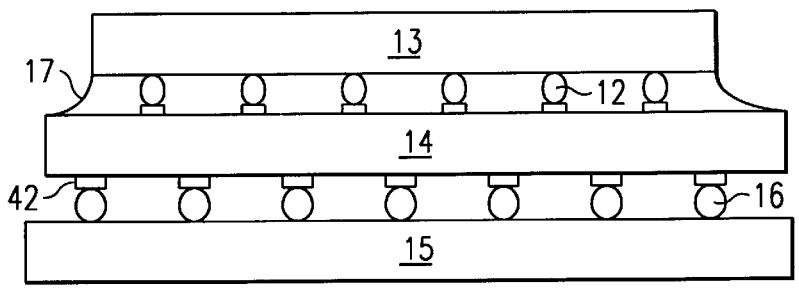
FIG. 1B is a cross sectional view of a area array package depicting a packaging configuration utilizing the principles of the present invention.

For example, when a die 13 is mounted in an flip chip configuration, the die circuitry mounted face down, each side of substrate 14 may be populated with different sized solder particles 12 and 16. Die 13 may, for example, be attached to substrate 14 simultaneously with the transfer of solder particles 12 to the surface of substrate 14, or the particles 12 may be transferred prior to loading die 13. The other side of substrate 14, populated with different sized solder particles 16, may be attached to PCB 15 as depicted in FIG. 1B.

Area array package 10 may include designs such as a CSP or a flip chip package. Solder particles 12 and 16 formed on the contact pads 42 of the substrate 14 are used to complete the connection to another electronic component, such as a PCB 15. Die 13 may also be connected to electronic components through a flip-chip electronic package design in which, solder particles 12 are attached directly to the input and output ports on the face of the die 13.

Attaching the flip-chip is carried out by aligning the solder particles 12 to the die 13 and then performing a second solder reflow operation. During the reflow, the solder particles 12 and 16 liquefy and make a bond to substrate 14 which has pads or traces to receive the solder. Following the solder reflow step, flip-chips often use a polymeric underfill 17 between the die 13 and the substrate 14 or PCB 15 to alleviate mechanical stress caused by the mismatch in the coefficients of thermal expansion (CTE) between the semiconductor chip 13, the interposer 14, if any, and the PCB 15. Many reliability problems occur due to the stress placed on the solder particles 12 when the integrated circuit is cycled from hot to cool during operation.

When another set of solder particles 16 on the opposite side of the interposer 14 is employed to complete the bonding process to a PCB 15, this second set may also be aligned and reflowed for attachment by the end user. When the chip 13 is attached to the substrate or interposer 14 as described, the final consumption of substrate or interposer area is usually not much larger than the area of chip 13. Consequently, this family of products is classified as chip scale packages.

Examples of conventional substrate materials include organic laminates, ceramics, metals, and polymeric sheets and films. Area array 10 may also be any suitable substrate to which solder particles may be attached to facilitate electrical connection of electronic devices.

While FIGS. 1A–1B have been described with reference to solder particles 12, it should be understood by one skilled in the art that the principles of the present invention are applicable to particles of a variety of compositions, such as minerals and synthetic compounds including polymers and plastics.

Figure 2A:
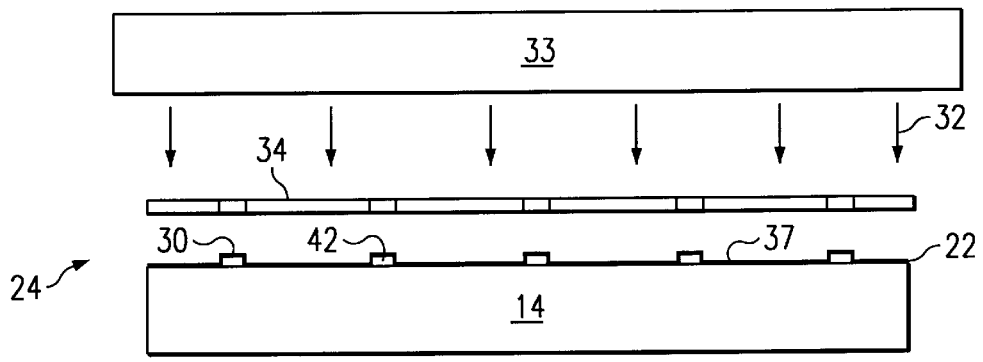
FIG. 2A is a cross-sectional view of a radiation source applied to a substrate having adhesive coating in accordance with the present invention.

FIG. 2A illustrates the formation of adhesive areas 30 on substrate 14 and is denoted generally as 24. In one embodiment of the invention, adhesive coating 22 may be applied directly to both faces of substrate 14 allowing for simultaneous transfer of both sets of solder particles 12 and 16; however, for convenience of illustration, only one such layer is depicted in FIG. 2A. Adhesive coating 22 is typically approximately 4 microns to approximately 6 microns thick; however, it should be understood by persons skilled in the art that the principles of the present invention are applicable to varying thicknesses.

In forming adhesive areas 30, photoimaging is utilized to create a plurality of discrete adhesive areas 30. Portions of adhesive coating 22 are exposed to radiation 32 from a radiation source 33 passing through a photomask 34. Portions of photomask 34 are opaque to radiation 32, thereby shielding portions of adhesive coating 22 from exposure to radiation 32. Radiation 32 may comprise, for example, ultraviolet radiation.

Upon exposure to radiation 32, areas exposed to radiation 37 lose adhesiveness. As a result, a plurality of discrete adhesive areas 30 coincident with contact pads 42 are formed, corresponding to the areas not exposed to radiation. The diameter of adhesive areas 30 is typically approximately half of the diameter of the corresponding solder particles 12 (or 16); however, it should be understood by persons skilled in the art that the principles of the present invention are applicable to adhesive areas 30 of other dimensions.

Figure 2B:
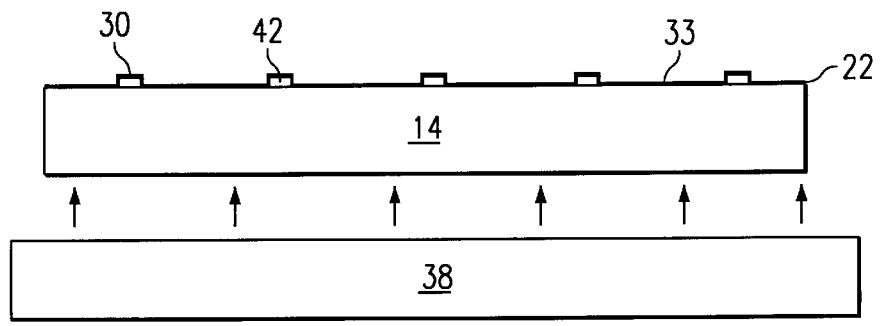
FIG. 2B is a cross-sectional view of a thermal energy source applied to a substrate having adhesive coating in accordance with the present invention.

As depicted in FIG. 2B, significant improvement is obtained in the adhesive properties of adhesive coating 22 by application of thermal energy 38 in accordance with the present invention. For example, it increases the adhesiveness of adhesive areas 30, thereby improving the likelihood of each of the adhesive areas 30 capturing and retaining one of the solder particles 12. Such a configuration of attachment of one of the solder particles 12 to each of the adhesive areas 30 is generally termed 100% yield, or full population.

Thermal energy 38 is maintained for a predetermined period of time, for example, one to sixty seconds. A temperature in the range from above room temperature to below the melting point of solder particles 12 may be used depending upon the particular composition of adhesive coating 22.

Enhanced yield is achieved by application of thermal energy 38 which reduces the need for repeated loading cycles in an effort to fully populate adhesive coated substrate 24. A reduction in cycle time, in turn, reduces operational costs.

Furthermore, application of thermal energy 38 to adhesive areas 30 reduces the negative effects of contamination and tribocharging. Tribocharging is the ionic charging of particles resulting from moving the particles in the air. Generation of electrostatic charges through the effects of tribocharging often results in increased numbers of excess solder particles 36 (FIG. 4A) residing on adhesive coating 22 and solder particles 12 clinging together in pairs or triplets, for example. Also, the surface texture and contamination of solder particles 12 has an adverse effect on attachment of solder particles 12 to adhesive areas 30. For example, solder particles 12 with surface oxides are more apt to collect electrostatic charges than oxide-free solder particles.

Figure 3:
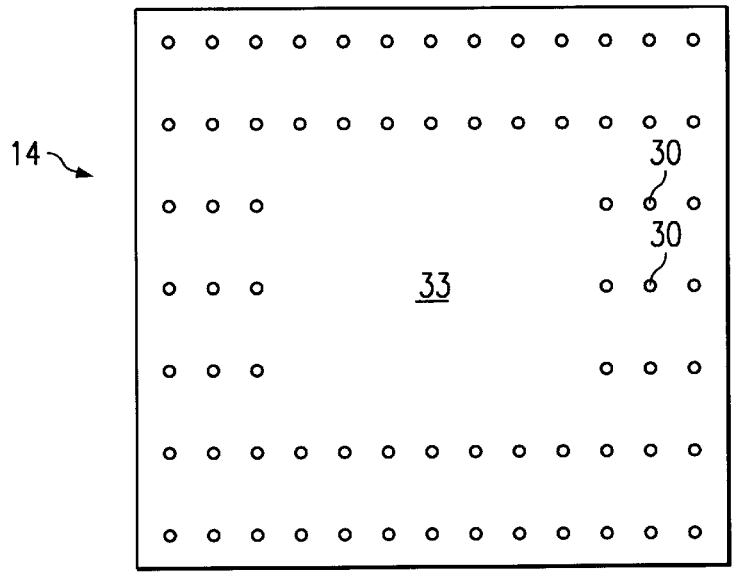
FIG. 3 is a plan view of a substrate having an adhesive coating for use in the present invention.

In FIG. 3, adhesive coated substrate 24 with adhesive areas 30 over a plurality of contact pads 42 one side is depicted. Adhesive areas 30 may have a variety of configurations, such as circular, oval, square, rectangular, and others. For example, as depicted, adhesive areas 30 may be circular areas suitable for receiving spherical solder particles 12. Each surface of substrate 14 may consist of different sized contact pads 42, and therefore may be populated in two different steps, however, if both sides receive the same sized solder particles 12 and 16 the population step may occur simultaneously. It also should be mentioned that different sized contact pads 42 does not necessarily mean different sized solder particles 12 and 16.

Figure 4A:
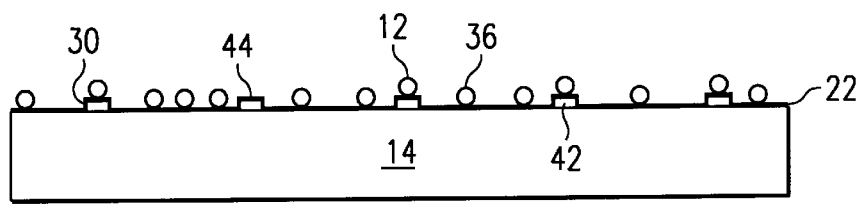
FIG. 4A is a cross-sectional view of a substrate having an adhesive coating with solder particles attached thereon in accordance with the present invention.

During or directly following the step of applying thermal energy 38 is the step of loading, or transferring, solder particles 12 onto substrate 14, as depicted in FIG. 4A. A plurality of solder particles 12, including excess solder particles 36, are loaded onto one or both surfaces of substrate 14. For convenience of illustration, only one surface is depicted in FIG. 4A. Solder particles 12 are captured and retained by adhesive areas 30. Excess solder particles 36 may lie on other portions of adhesive layer 22 and may be removed by several different means.

Figure 4B:
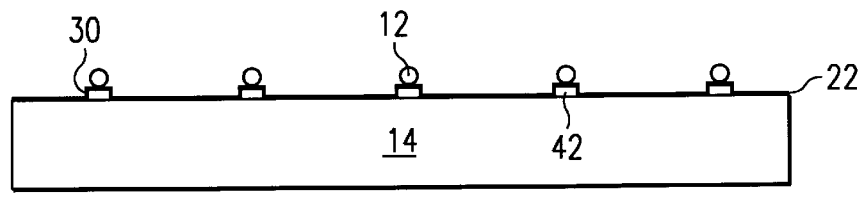
FIG. 4B is a cross-sectional view of a fully populated substrate having an adhesive coating in accordance with the present invention.
Figure 5:
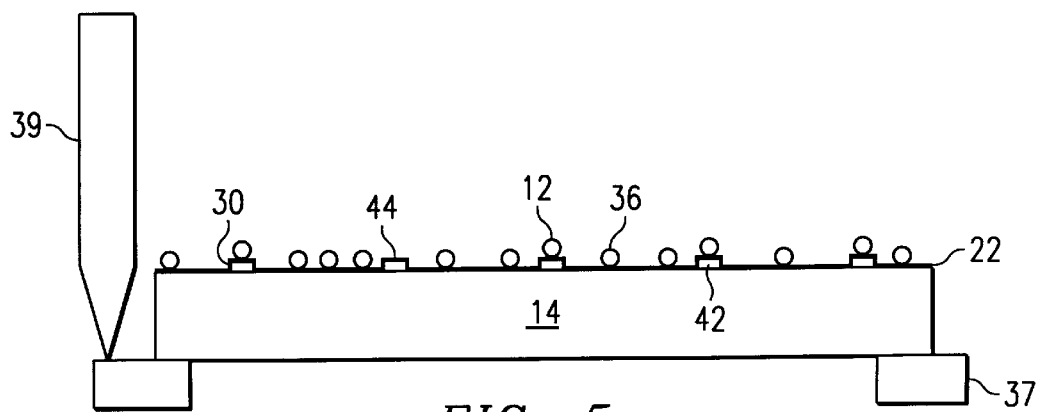
FIG. 5 is a plan view of a substrate coated with an adhesive layer loaded with solder particles after vibration by a mechanical device.

A fully populated adhesive coated substrate 24 is shown in FIG. 4B. To ensure that a solder particles 12 adhere to each adhesive area 30, kinetic energy may be applied to forcibly spread solder particles 12 over the entire surface of adhesive coated substrate 24. In one embodiment of the present invention, the vertical motion of mechanical device 39 may be placed against the top of support 37 to transfer kinetic energy to solder particles 12 as depicted in FIG. 5. In another embodiment of the present invention, mechanical device 39 may be placed on the side or below support 37 and normal to the surface of substrate 14. Alternatively, mechanical device 39 may be applied directly against the surface of adhesive coating 22.

The agitated state of solder particles 12 induced by mechanical device 39 significantly reduces the number of uncovered adhesive areas 44 without a solder particle 12. As shown in FIG. 4B, following application of mechanical device 39, each of adhesive areas 30 is covered by a solder particle 12.

Mechanical device 39 may be an automated device such as an engraving pencil or other vibrating instrument that operates at a suitable frequency. The frequency of the vibrations depends on several factors, including the area of substrate 14, the size of solder particles 12, the number of adhesive areas 30, and the complexity of the arrangement of contact pads 42 on semiconductor wafer 10. For example, frequencies in the range of approximately 1,000 strokes per minute to approximately 100,000 strokes per minute, are within the scope of the invention. Furthermore, other mechanical devices that are well known in the art may be utilized for transferring kinetic energy to solder particles 12.

Substrate 14, with solder particles 12 attached thereto and excess solder particles 36 residing thereon, may be positioned such that the surface of adhesive coating 22 having excess solder particles 36 residing thereon faces downward, and gravity pulls excess solder particles 36 away from of adhesive coated substrate 24. Gravitational forces, however, may not successfully remove all excess solder particles 36, which often cling to each other and to adhesive coated substrate 24 due to electrostatic forces. Therefore, mechanical device 39 may again be placed against support 37 normal to adhesive coated substrate 24 to transfer kinetic energy to solder particles 36, thereby removing any remaining excess solder particles 36. The loading of solder particles 12 and the removal of excess solder particles 36 is made more effective if ionizing equipment such as an AC corona discharge is used. Placing adhesive coated substrate 24 with particles 12 residing thereon under the influence of ionizing equipment is effective for preventing tribocharging of adhesive coated substrate 24 and solder particles 12. Suitable ionizing equipment is well known in the art, and may take a variety of configurations. For example, the ionizing equipment may be suspended above adhesive coated substrate 24, or may be an enclosure containing adhesive coated substrate 24.

Significant improvement is obtained by utilizing mechanical device 39 in accordance with the present invention. Mechanical device 39 both enhances loading of solder particles 12 and effectively removes excess solder particles 36. Combining these two functions in one automated mechanical device 39 reduces cycle time and eliminates equipment, which may significantly reduce operating costs.

As a result of utilizing mechanical device 39 for both enhancing loading of solder particles 12 and removing excess solder particles 36, only solder particles 12 adhered to adhesive areas 30 remain on substrate 14, with no excess solder particles 36, as depicted in FIGS. 4B. Furthermore, each of the adhesive areas 30 is covered by one solder particle 12 and none of solder particles 12 are clinging together.

Solder particles 12 used in the present invention may be securely attached to contact pads 42 using a variety of solder reflow systems, such as an optical heating reflow system, a vapor phase solder reflow system, infrared heating reflow system, or other solder reflow systems. Semiconductor die 13 or wafer may be attached to one side either during or after solder reflow of balls. Both populated sides may be reflowed at the same time, thus reducing assembly time and increasing cycle time. In an optical heating reflow system, radiant heat from near infrared optical sources such as tungsten-halogen lamps may be utilized for rapid thermal ramping with minimal thermal inertia, thereby shortening cycle time.

With a vapor phase solder reflow system, vapor condenses surround substrate 14 with a cloud of steam. A liquid, such as a nonchlorinated (non CFC) fluorocarbon is first heated with enough energy to form a vapor and to sustain a vapor cloud. Substrate 14 is then passed through the vapor, the vaporized liquid condenses thereon and gives off the latent heat of vaporization. This energy is then transferred to substrate 14. As long as substrate 14 remains in the vapor, the vapor continues to give off energy at a repeatable fixed rate and temperature, until substrate 14 reaches the temperature of the vapor.

Figure 6:
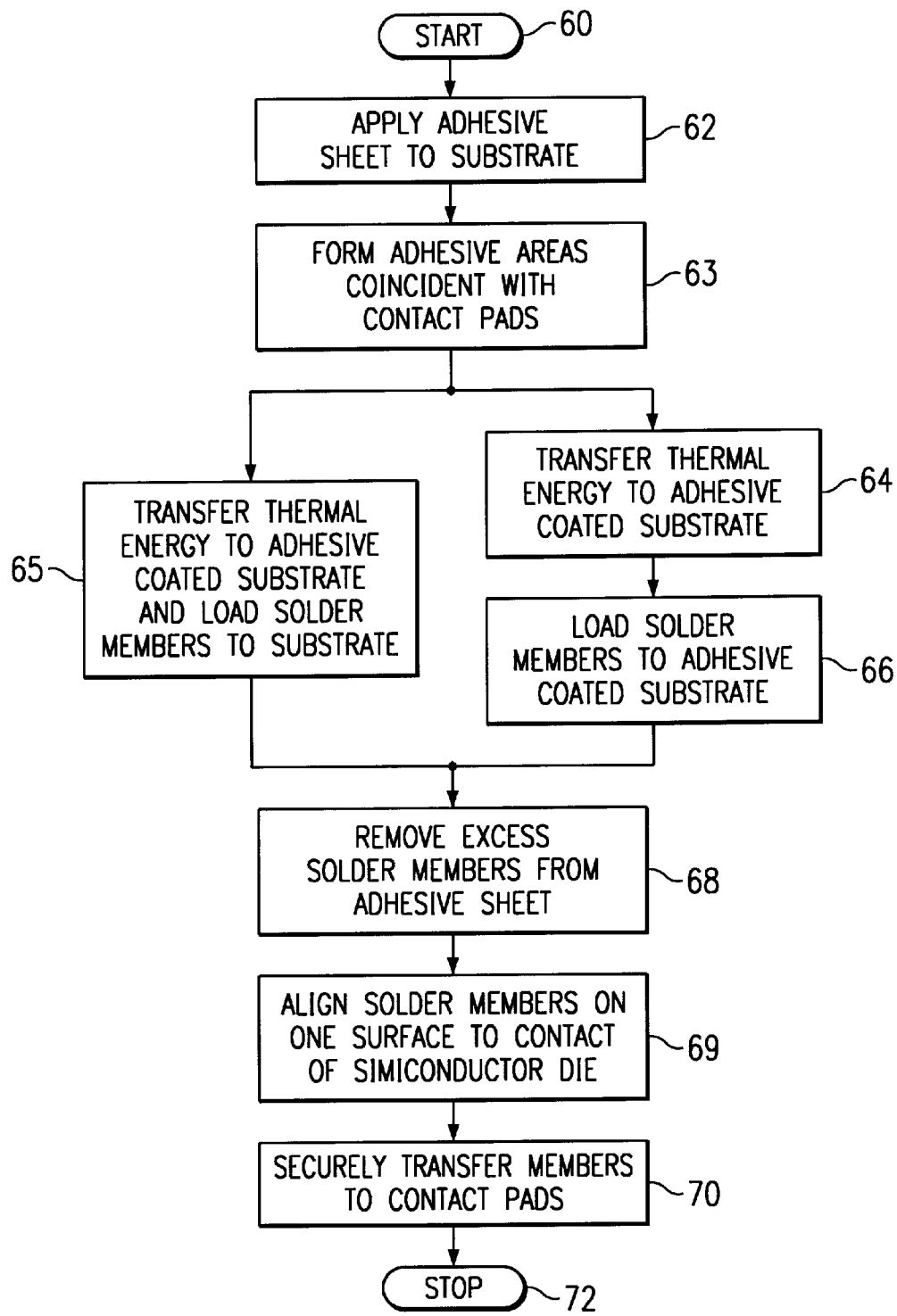
FIG. 6 is a process flow diagram for a method of attaching solder particles to a substrate in accordance with the present invention.

FIG. 6 is a process flow chart for the attachment of solder particles 12 and 16 to substrate 14. The method step begins at step 60. According to the invention, in step 62, an adhesive coating is applied across one or both surfaces of substrate 14 according to FIG. 2A. Adhesive areas 30 are formed coincident with contact pads 42, step 63, as described with reference to FIG. 2A. At step 64, thermal energy 38 is radiantly, conductively or convectively transferred from thermal energy source 40 to substrate 14, as described with reference to FIG. 2B. Step 64 may occur before loading solder particles 12 to the surface of substrate 14 as in step 66, as described with reference to FIG. 4B. Alternatively, steps 64 and 66 may occur simultaneously, as in step 65.

Next, at step 68, excess solder particles 36 are removed from substrate 14, by application of kinetic energy or some other means. Next, step 69, solder particles 12 and 16 are aligned on one surface of substrate 14 to contact pads of semiconductor die 13. Solder particles 12 and 16 are then securely attached to contact pads 42 via reflow, for example, in a manner of choice.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for populating a substrate having first and second opposite surfaces with particles, the method comprising the steps of:

applying an adhesive coating to the first and second surfaces of the substrate; and loading the particles on said adhesive coating on the first and second surfaces, thereby populating both surfaces of the substrate with the particles.

2. The method as recited in claim 1 further comprising the step of transferring thermal energy to said adhesive layers.

3. The method as recited in claim 2, wherein the step of transferring thermal energy further includes maintaining a temperature between room temperature and the melting point of said particles.

4. The method as recited in claim 2 wherein the step of transferring thermal energy and the step of loading the particles occur simultaneously.

5. The method as recited in claim 1, wherein the particles are composed of solder alloy.

6. The method as recited in claim 1, wherein the particles are composed of plastic materials.

7. The method as recited in claim 1 wherein said adhesive coating further comprises adhesive areas positioned on contact pads of the substrate.

8. The method as recited in claim 7, further comprising the step of removing excess particles from the substrate not positioned on said adhesive areas.

9. The method as recited in claim 1, further comprising the step of reflowing particles on said first and second surfaces of the substrate to form metallurgical bonds.

* * * * *